US012183716B2

(12) United States Patent
Zhou et al.

(10) Patent No.: US 12,183,716 B2
(45) Date of Patent: Dec. 31, 2024

(54) MONOLITHIC CONDUCTIVE COLUMNS IN A SEMICONDUCTOR DEVICE AND ASSOCIATED METHODS

(71) Applicant: Micron Technology, Inc., Boise, ID (US)

(72) Inventors: Wei Zhou, Boise, ID (US); Kyle K. Kirby, Eagle, ID (US); Bret K Street, Meridian, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 374 days.

(21) Appl. No.: 17/711,583

(22) Filed: Apr. 1, 2022

(65) Prior Publication Data

US 2023/0260964 A1     Aug. 17, 2023

Related U.S. Application Data

(60) Provisional application No. 63/309,469, filed on Feb. 11, 2022.

(51) Int. Cl.
*H01L 25/00* (2006.01)
*H01L 25/065* (2023.01)

(52) U.S. Cl.
CPC .......... *H01L 25/0657* (2013.01); *H01L 25/50* (2013.01); *H01L 2225/06541* (2013.01);
(Continued)

(58) Field of Classification Search
CPC .............................. H01L 25/50; H01L 25/0657
See application file for complete search history.

(56) References Cited

U.S. PATENT DOCUMENTS

| 8,563,403 B1 | 10/2013 | Farooq et al. |
| 9,865,570 B1 | 1/2018 | England et al. |

(Continued)

FOREIGN PATENT DOCUMENTS

| CN | 116598278 A | 8/2023 |
| CN | 116598286 A | 8/2023 |

(Continued)

OTHER PUBLICATIONS

U.S. Appl. No. 17/670,378—Unpublished Patent Application to Wei Zhou et al., filed Feb. 11, 2022, titled "Monolithic Conductive Coulmn in a Semiconductor Device and Associated Methods", 42 pages.

(Continued)

*Primary Examiner* — Thao P Le
(74) *Attorney, Agent, or Firm* — Perkins Coie LLP

(57) ABSTRACT

A semiconductor device having monolithic conductive columns, and associated systems and methods, are disclosed herein. The semiconductor device can include a semiconductor die and a molding material. The semiconductor die may have a semiconductor substrate, a conductive pad, an opening, a non-conductive liner, and a plug of non-conductive material. The conductive pad may be at a surface of the semiconductor substrate. The opening may extend through the semiconductor substrate from the conductive pad to a second surface and define a side wall. The liner may coat the side wall and the plug may fill the opening. A second opening may be formed through the semiconductor device and the opening and a conductive material plated therein. The molding material may be laterally adjacent to the semiconductor die.

20 Claims, 21 Drawing Sheets

(52) U.S. Cl.
CPC .............. *H01L 2225/06586* (2013.01); *H01L 2225/06589* (2013.01)

(56) References Cited

U.S. PATENT DOCUMENTS

| | | | |
|---|---|---|---|
| 11,562,982 B2* | 1/2023 | Hu | .......................... H01L 25/50 |
| 2008/0164573 A1 | 7/2008 | Basker et al. | |
| 2008/0284037 A1 | 11/2008 | Andry et al. | |
| 2010/0013073 A1 | 1/2010 | Andry et al. | |
| 2010/0171218 A1 | 7/2010 | Aoi | |
| 2010/0264551 A1 | 10/2010 | Farooq et al. | |
| 2011/0140126 A1 | 6/2011 | Gaul et al. | |
| 2021/0111102 A1 | 4/2021 | Gambino et al. | |
| 2021/0134705 A1 | 5/2021 | Ma | |
| 2021/0202391 A1* | 7/2021 | Chun | .................. H01L 21/6835 |
| 2021/0305226 A1 | 9/2021 | Tsai et al. | |
| 2021/0407891 A1 | 12/2021 | Ma | |
| 2022/0013461 A1* | 1/2022 | Lin | ...................... H01L 21/4857 |
| 2022/0262771 A1* | 8/2022 | Chen | ........................ H01L 24/24 |
| 2023/0260875 A1 | 8/2023 | Zhou et al. | |
| 2023/0260876 A1 | 8/2023 | Zhou et al. | |
| 2023/0260877 A1 | 8/2023 | Zhou et al. | |
| 2023/0260964 A1 | 8/2023 | Zhou et al. | |
| 2023/0352413 A1 | 11/2023 | Sheng et al. | |
| 2024/0063183 A1 | 2/2024 | Elsherbini et al. | |
| 2024/0071965 A1* | 2/2024 | Shao | ..................... H01L 23/481 |
| 2024/0145431 A1* | 5/2024 | Chen | ....................... H01L 24/08 |

FOREIGN PATENT DOCUMENTS

| | | |
|---|---|---|
| WO | 2010035375 A1 | 4/2010 |
| WO | 2021119924 A1 | 6/2021 |

OTHER PUBLICATIONS

U.S. Appl. No. 17/670,391—Unpublished Patent Application to Wei Zhou et al., filed Feb. 11, 2022, titled "Monolithic Conductive Column in a Semiconductor Device and Associated Methods", 43 pages.

U.S. Appl. No. 17/670,393—Unpublished Patent Application to Wei Zhou et al., filed Feb. 11, 2022, titled "Monolithic Conductive Cylinder in a Semiconductor Device and Associated Methods", 44 pages.

* cited by examiner

MONOLITHIC CONDUCTIVE COLUMNS IN A SEMICONDUCTOR DEVICE AND ASSOCIATED METHODS

CROSS-REFERENCE TO RELATED APPLICATIONS

The present application claims priority to U.S. Provisional Patent Application No. 63/309,469, filed Feb. 11, 2022, the disclosure of which is incorporated herein by reference in its entirety.

This application contains subject matter related to an U.S. Patent Application by Wei Zhou et al. titled "MONOLITHIC CONDUCTIVE COLUMN IN A SEMICONDUCTOR DEVICE AND ASSOCIATED METHODS." The related application is assigned to Micron Technology, Inc., and is identified as U.S. patent application Ser. No. 17/670,378, filed Feb. 11, 2022. The subject matter thereof is incorporated herein by reference thereto.

This application contains subject matter related to an U.S. Patent Application by Wei Zhou et al. titled "MONOLITHIC CONDUCTIVE COLUMN IN A SEMICONDUCTOR DEVICE AND ASSOCIATED METHODS." The related application is assigned to Micron Technology, Inc., and is identified as U.S. patent application Ser. No. 17/670,391, filed Feb. 11, 2022. The subject matter thereof is incorporated herein by reference thereto.

This application contains subject matter related to an U.S. Patent Application by Wei Zhou et al. titled "MONOLITHIC CONDUCTIVE CYLINDER IN A SEMICONDUCTOR DEVICE AND ASSOCIATED METHODS." The related application is assigned to Micron Technology, Inc., and is identified as U.S. patent application Ser. No. 17/670,393, filed Feb. 11, 2022. The subject matter thereof is incorporated herein by reference thereto.

TECHNICAL FIELD

The present disclosure is generally related to systems and methods for semiconductor devices. In particular, the present technology relates to semiconductor devices having monolithic conductive columns in electric communication with dies in the semiconductor devices.

BACKGROUND

Microelectronic devices, such as memory devices, microprocessors, and other electronics, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies while increasing the capacity and/or speed of the resulting semiconductor assemblies. To meet these demands, semiconductor die manufacturers often stack multiple semiconductor dies vertically on top of each other to increase the capacity or performance of a microelectronic device within the limited area on a circuit board or other element to which the semiconductor dies and/or assemblies are mounted. While this method may increase capacity and performance, it presents structural and functional concerns for the semiconductor assemblies.

Structurally, one method semiconductor die manufacturers attempt to reduce semiconductor device assembly volume is by reducing the bond line thickness. However, this reduction can cause problems with bonds between the dies. For example, with conventional dies, a conductive column within each die is provided to electrically interconnect the dies together. Given the extremely small scale of semiconductor dies, these conductive columns can easily be under- or overfilled with conductive material. When underfilled, a concave recess forms at the top of the column within the conductive material sunken from an exterior surface of the die. This concave recess may lead to ineffective bonding between dies when soldered together. When overfilled, a convex protrusion of conductive material forms at the top of the column extending out from the exterior surface of the die. This convex protrusion may similarly lead to ineffective bonding between dies when soldered together or die separation (e.g., dies bonded together separating from one another). These issues are compounded by the conductive material expanding or generating stress, pressure, or other forces against the adjacent die as the conductive material cools, solidifies, crystallizes, or undergoes a similar post-manufacturing settling phase.

Regarding performance, stacking semiconductor dies may limit the ability to deliver electricity vertically within a stacked semiconductor die assembly. Given the small scale of semiconductor dies and priority of using space within the semiconductor dies for memory devices, microprocessors, and other electronics, conductive columns often are required to occupy very limited space. When the conductive columns are small, material property constraints limit the ability to pass electricity through them. This limit therefore limits the ability to transfer electricity vertically through the stack of semiconductor dies in the assembly, therefore reducing performance of the stacked semiconductor die assembly overall.

Figure 1:
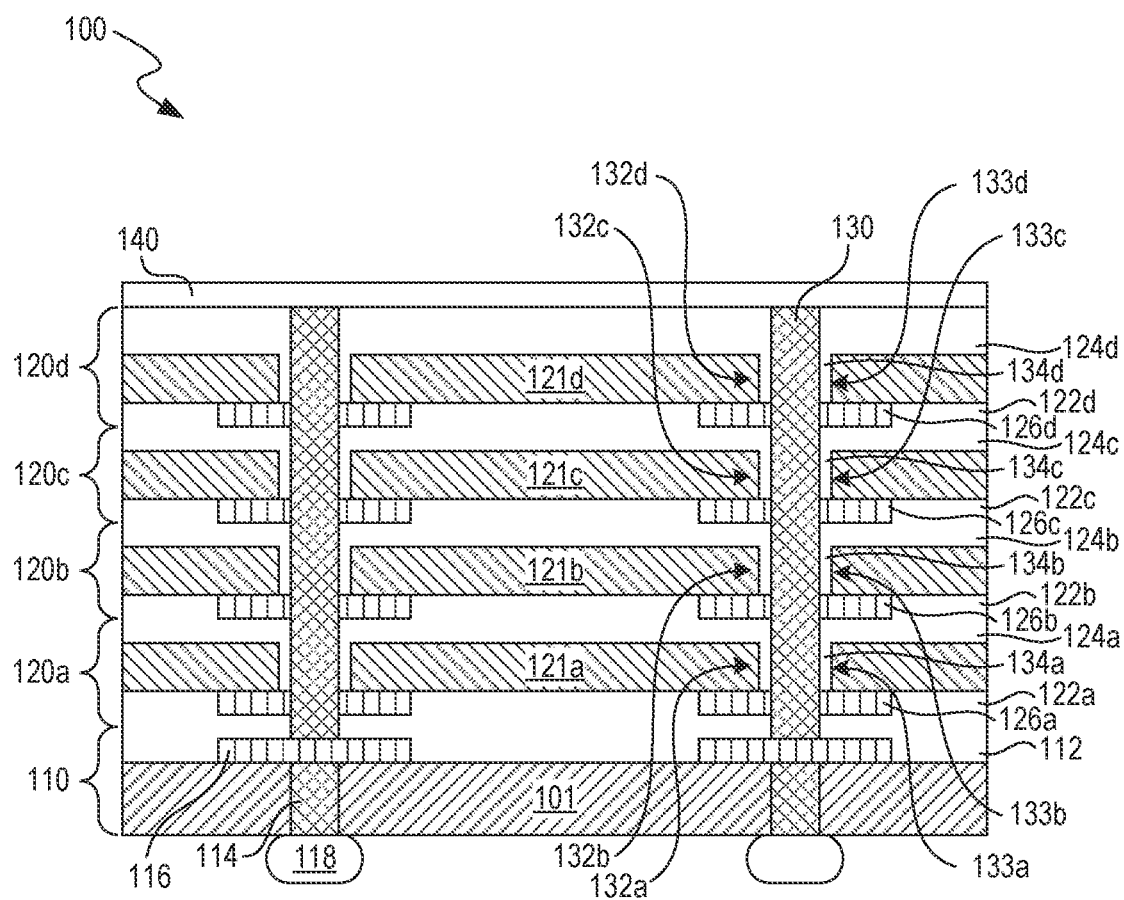
FIG. 1 is a cross-sectional view of a semiconductor device assembly with monolithic conductive columns extending through dies and molding material in accordance with some embodiments of the present technology.

The drawings have not necessarily been drawn to scale. Similarly, some components and/or operations can be separated into different blocks or combined into a single block for the purpose of discussion of some of the implementations of the present technology. Moreover, while the technology is amenable to various modifications and alternative forms, specific implementations have been shown by way of example in the drawings and are described in detail below.

DETAILED DESCRIPTION

Overview

A semiconductor device having monolithic conductive columns, and associated assemblies and methods, are disclosed herein. The semiconductor device includes a semiconductor die and a molding material. The semiconductor die has a substrate, a conductive pad, an opening, a non-conductive liner, a plug of non-conductive material, and a first and second dielectric layer. The semiconductor substrate has a first surface and a second surface opposite the first surface. The conductive pad is at the first surface of the semiconductor substrate. The opening extends through the semiconductor substrate from the conductive pad at the first surface to the second surface and defines an opening side wall. The non-conductive liner coats the opening side wall from the first surface to the second surface of the semiconductor substrate. The plug of non-conductive material fills the opening from the first surface to the second surface of the semiconductor substrate. The first dielectric layer covers the first surface of the semiconductor substrate and the conductive pad, and the second dielectric layer covers the second surface of the semiconductor substrate, the liner, and the plug. The molding material is laterally adjacent to the semiconductor die.

The semiconductor device may be incorporated into a semiconductor device assembly including a base die, a plurality of the semiconductor devices, a molding material, and a die and mold monolithic conductive column. The base die has a base semiconductor substrate with an upper surface, a die conductive pad and a mold conductive pad on the upper surface, and a base dielectric layer over the die conductive pad, the mold conductive pad, and the upper surface. The plurality of semiconductor devices each include the semiconductor substrate, the conductive pad, the opening, the non-conductive liner, and the first and second dielectric layers, and are stacked over the base die with each opening of the plurality of semiconductor devices vertically aligned with the die conductive pad. The die monolithic conductive column extends from the die conductive pad through the opening of each of the plurality of semiconductor devices and is in electric communication with each of the semiconductor devices through their respective conductive pads. The mold monolithic conductive column extends from the mold conductive pad through the molding material.

The semiconductor device assembly may be manufactured by preparing the base die and the plurality of semiconductor devices, consecutively stacking the plurality of semiconductor devices over the base die, bonding the newly stacked semiconductor devices to the previously stacked semiconductor device, laterally encasing the stacked plurality of semiconductor devices in a molding material, forming a device opening through the stacked plurality of semiconductor devices extending through the conductive pads of each of the plurality of semiconductor devices, forming a mold opening through the molding material, and forming a conductive material within the die and mold openings.

For ease of reference, the semiconductor device assembly and device and the components therein are sometimes described herein with reference to top and bottom, upper and lower, upwards and downwards, and/or horizontal plane, x-y plane, vertical, or z-direction relative to the spatial orientation of the embodiments shown in the figures. It is to be understood, however, that the stacked semiconductor device and the components therein can be moved to, and used in, different spatial orientations without changing the structure and/or function of the disclosed embodiments of the present technology.

DESCRIPTION OF THE FIGURES

FIG. 1 is a cross-sectional view of a semiconductor device assembly 100 ("assembly 100") with monolithic conductive columns 130 extending through and in electric communication with semiconductor dies 110, 120a-d and monolithic conductive columns 135 extending through molding material 160 in accordance with some embodiments of the present technology. In the illustrated embodiment, the assembly 100 includes (i) a base die 110, (ii) four semiconductor dies 120a-d (collectively "dies 120a-d." individually die 120a, 120b, 120c, or 120d) over the base die 110, (iii) two molds 160 laterally adjacent to the dies 120a-d. (iv) a cover layer 140 with a top surface and a bottom surface opposite the top surface over the die 120d and the molds 160, and (v) two monolithic conductive columns 130 (e.g., die through-substrate vias, "die TSVs 130") and two monolithic conductive columns 135 (e.g., through-mold vias, "TMVs 135") extending from the bottom surface of the cover layer 140 to the base die 110. In some embodiments, the assembly 100 may exclude the base die 110 or the base die 110 may be replaced with a die generally corresponding with the dies 120a-d. In some embodiments, the assembly 100 may include additional (e.g., 5, 6, etc.) or fewer (e.g., 2 or 3) dies generally corresponding with the dies 120a-d. In some embodiments, the assembly 100 may include additional (e.g., 3, 4, etc.) or a single die TSV 130. In some embodiments, the assembly 100 may include additional (e.g., 3, 4, etc.) or a single TMV 135.

As illustrated in FIG. 1, the base die 110 may include (i) a base wafer 101 having a top surface and a bottom surface opposite the top surface, (ii) one or more base-die pads 116a and one or more base-mold pads 116b (collectively, the "base conductive pads 116") on the top surface of the base wafer 101, and (iii) a base dielectric layer 112 at least partially covering the top surface of the base wafer 101 and the base conductive pads 116. The base-die pads 116a each may be in electric communication and vertically aligned with a corresponding die TSV 130. The base-mold pads 116b may each be in electric communication and vertically aligned with a corresponding TMV 135.

In some embodiments, the base wafer 101 can include conductive and dielectric materials that can be formed using an additive process, including, but not limited to, sputtering, physical vapor deposition (PVD), electroplating, lithography, or other similar processes. In some embodiments, the base dielectric layer 112 can be formed from a suitable dielectric, non-conductive material such as parylene, polyimide, low temperature chemical vapor deposition (CVD) materials (such as tetraethylorthosilicate (TEOS), silicon nitride (Si3N4), silicon oxide (SiO2)) or other suitable dielectric, non-conductive materials using a similar additive process to the base wafer 101. The base dielectric layer 112 may have a thickness in a vertical dimension of 50 nm, 100 nm, 200 nm, 300 nm, or 400 nm. The base dielectric layer 112 may further have a thickness larger, smaller, or between these values.

In some embodiments, the base conductive pads 116 can be formed from a suitable conductive metal (or metal plating) such as copper, gold, silver, aluminum, tungsten, cobalt, nickel, or any other suitable conductive material formed using an additive process, including, but not limited to, plating, depositing, or any other suitable method of manufacture for forming base conductive pads 116 on the base wafer 101. The base conductive pads 116 may have a thickness in a vertical dimension of 0.8 µm, 1.0 µm, 1.2 µm, or 1.4 µm. The base conductive pads 116 may further have a thickness larger, smaller, or between these values. In some embodiments, the base conductive pads 116 can be formed from the same conductive material and/or different conductive materials, or may have the same or different thicknesses. For example, in some embodiments, some base conductive pads 116 may be formed from copper while other base conductive pads 116 are formed from gold. The copper construction of some base conductive pads 116 can help reduce manufacturing costs while the gold construction of other base conductive pads 116 can help improve the conductivity of the base conductive pads 116. In some embodiments the base conductive pads 116 may all have a top surface in plane with one another. In other embodiments the base-die pads 116a and the base-mold pads 116b may have top surfaces in difference planes.

The dies 120a-d, as illustrated in FIG. 1 and in reference to a generalized semiconductor die 120, each may include (i) a die wafer 121 having a top surface and a bottom surface opposite the top surface, (ii) die openings 132 in the die wafer 121 extending from the top surface to the bottom surface and defining die opening walls 133, (iii) liners 134 on the die opening walls 133, (iv) one or more die conductive pads 126 on the bottom surface of the die wafer 121 and each in vertical alignment with a corresponding die opening 132, (v) a bottom (e.g., lower) dielectric layer 122 on the bottom surface of the die wafer 121 and at least partially covering the bottom surface and the die conductive pads 126, and (vi) a top (e.g., upper) dielectric layer 124 on the top surface of the die wafer 121 at least partially covering the top surface. The die openings 132, within the liners 134, may be filled by a portion of a corresponding die TSV 130 extending through the die 120 in alignment with the die opening 132 and the die conductive pad 126. The die TSV 130 may be in electric communication with the corresponding die conductive pad 126 and further in electric communication with the corresponding die wafer 121 via its respective die conductive pad 126. In some embodiments, the die conductive pad 126 may be on the top surface of the die wafer 121, or at least one die conductive pad 126 may be on each of the top and the bottom surfaces of the die wafer 121, respectively.

The dies 120a-d may be consecutively stacked over the base die 110 and bonded to the assembly 100 with their die openings 132a-d in alignment with a corresponding base-die pad 116a. In this arrangement, the die TSVs 130 may extend through the assembly 100 along the die openings 132a-d until contacting the corresponding base-die pad 116a. The die 120a (e.g., first or bottom die) may be stacked and bonded to the base die 110 with the die openings 132a in vertical alignment with the corresponding base-die pad 116a. The die 120b (e.g., second die) may be stacked and bonded to the die 120a with the die openings 132b in vertical alignment with the corresponding die openings 132a and base-die pad 116a. The die 120c (e.g., third die), the die 120d (e.g., fourth or top die), and one or more additional dies 120 may similarly be stacked and bonded to the assembly 100 with their die openings 132c, 132d vertically aligned with corresponding lower die openings 132a, 132c and base-die pad 116a. In some embodiments, bonding of two dies (e.g., base die 110, dies 120a-d) may utilize a direct bonding process between opposing dielectric layers (e.g., base dielectric layer 112, top and bottom dielectric layers 122a-d, 124a-d) of the dies. In some embodiments, any suitable alternative bonding process may be used to bond opposing dielectric layers. For example, the bottom dielectric layer 122b of the die 120b may be directly bonded to the top dielectric layer 124a of the die 120a with the die openings 132a, 132b in vertical alignment.

The die wafer 121 can be generally similar to the base wafer 101 in construction and material composition. The die wafer 121 may have a thickness in a vertical dimension of 8 μm, 10 μm, 12 μm, or 14 μm, or any thickness larger, smaller, or between these values. Additionally, the top and bottom dielectric layers 122, 124 and the die conductive pads 126 can generally be similar to the base dielectric layer 112 and the base conductive pads 116, respectively, in construction and material composition. In some embodiments, the dielectric layers (e.g., base dielectric layer 112, cover layer 140, top and bottom dielectric layers 122, 124) and the conductive pads (e.g., base conductive pads 116, die conductive pads 126) can have the same construction and material composition, respectively. In other embodiments, only some dielectric layers or some conductive pads can have the same construction and material composition, respectively. In other embodiments, the dielectric layers or the conductive pads can all have a different construction and material composition, respectively.

The molds 160 may be columns of easily etchable molding material laterally adjacent to the dies 120a-d extending from the top surface of the base die 110 to the bottom surface of the cover layer 140. The molds 160 may be manufactured into the assembly 100 after the dies 120a-d are consecutively bonded to the assembly 100 to encase at least a portion of a lateral exterior of and to provide structural support and protection to the dies 120a-d. The molds 160 may be formed by dipping the assembly 100, dies 120a-d first, into a liquid molding material, allowing the material to harden, and mechanically etching excess hardened molding material from the assembly 100 to re-expose the die 120d, creating an interim top surface of the assembly 100. The molding material may include an epoxy-based molding material or may include any other suitable, non-conductive material providing structural support to the assembly 100. In some embodiments the molding material may be hardened by allowing the assembly 100 to sit, by curing the molding material using specialized light, or by any other suitable method for hardening the molding material. Once the excess molding material 160 is etched to re-expose the die 120d, the cover layer 140 may be applied to the interim top surface of the assembly 100.

The die TSVs 130 and the TMVs 135 may be a single elongated piece of conductive material (e.g., monolithic conductive column) extending through the dies 120a-d and molds 160, respectively, from the base die 110 to the bottom surface of the cover layer 140. To achieve this structure, the die TSVs 130 and the TMVs 135 may be manufactured into the assembly 100 in a single manufacturing step, such as a single plating operation (discussed in detail in reference to FIGS. 18 and 19) after the dies 120a-d are consecutively bonded to the assembly 100 and assembly openings 138, 139 (individually, "die assembly openings 138," "mold openings 139") etched therein. Each die TSV 130 may extend through corresponding die openings 132a-d and may be in electric communication with the dies 120a-d via a corresponding die conductive pad 126a-d, respectively. Each die TSV 130 may also be in electric communication with the base die 110 via a corresponding base-die pad 116a. Each TMV 135 may be in electric communication with the base die 110 via a corresponding base-mold pad 116b. In some embodiments, the die TSVs 130 and the TMVs 135 may be formed from a suitable conductive metal (or metal plating) such as copper, gold, silver, aluminum, tungsten, cobalt, nickel, or any other suitable conductive material formed using an additive process, including, but not limited to, plating, depositing, sintering, or any other suitable manufacturing method for forming the die TSVs 130 and TMVs 135 within elongated openings (assembly openings 138, 139, FIG. 18) formed in the assembly 100 after the dies 120a-d are bonded to the assembly 100.

One or more electric connectors 118 may be coupled to the top surface of the cover layer 140 and one or more external through-substrate vias 114 ("external TSVs 114") may extend through the cover layer 140 from the top surface to the bottom surface of the cover layer 140. The electric connectors 118 may each have a corresponding external TSV 114 and die TSV 130 or TMV 135, all in a vertical alignment. The electric connectors 118 may be in electric communication with the corresponding external TSV 114 and die TSV 130 or TMV 135. The electric connectors 118 having the corresponding die TSVs 130 may be in electric communication with the dies 120a-d via the corresponding die conductive pads 126a-d. The electric connectors 118 having the corresponding TMV 135 may be in electric communication with the base die 110 via a corresponding base conductive pad 116. The electric connectors 118 may be any device or assembly suitable for providing an external electric connection into the assembly 100. The external TSVs 114 may be generally similar to die TSVs 130 and TMVs 135 in construction and material composition.

Figure 2:
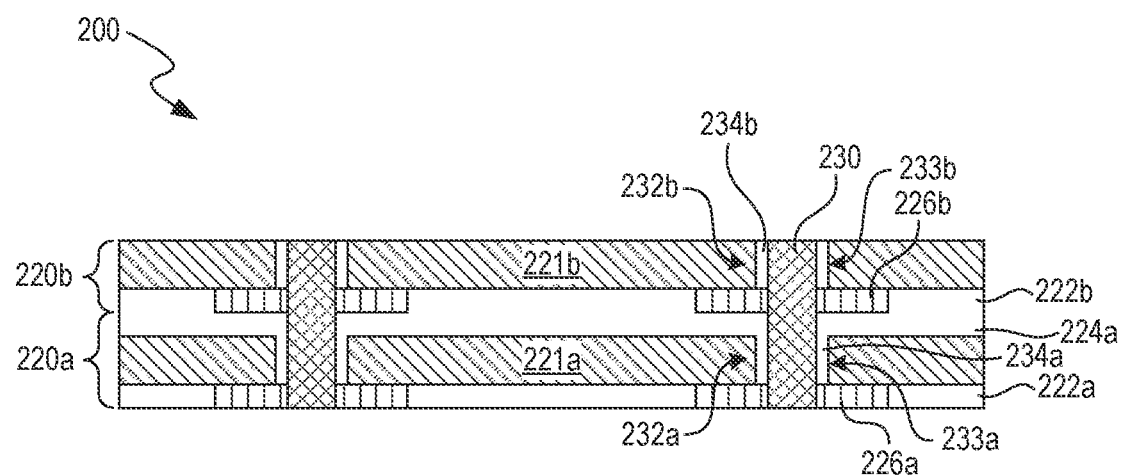
FIG. 2 is a cross-sectional view of a semiconductor device with monolithic conductive columns extending through two dies and molding material in accordance with some embodiments of the present technology.

FIG. 2 is a cross-sectional view of a semiconductor device 200 ("device 200") with monolithic conductive columns 230 extending through and in electric communication with semiconductor dies 220a, 220b and monolithic conductive columns 235 extending through molding material 260 in accordance with some embodiments of the present technology. One or more devices 200 may be implemented within the assembly 100, as described in reference to FIG. 1. Additionally or alternatively, one or more devices 200 may be implemented within a semiconductor device assembly generally similar to the assembly 100 or a semiconductor device assembly including all, some, or similar elements as the assembly 100. In the illustrated embodiment, the device 200 includes (i) a first die 220a and a second die 220b ("dies 220a, 220b"), (ii) two monolithic conductive columns 230 (e.g., device through-substrate vias, "device TSVs 230"), (iii) two molds 260 laterally adjacent to the dies 220a, 220b, and (iv) two monolithic conductive columns 235 (e.g., through-mold vias, "TMVs 235"). Elements of the device 200 may correspond with similar elements of the assembly 100 and may be generally similar in structure and material composition. The method for manufacturing the device 200 may similarly correspond, in whole or in part, with the method for manufacturing the assembly 100 (illustrated and further described regarding FIGS. 3-19B). In some embodiments, the device 200 may include additional (e.g., 3, 4, etc.) dies and extended molds and TMVs generally corresponding with the dies 220a, 220b, molds 260, and TMVs 235, respectively. In some embodiments, the device 200 may include additional (e.g., 3, 4, etc.) or a single device TSV 230. In some embodiments, the device 200 may include additional (e.g., 3, 4, etc.) or a single TMV 235.

As similarly discussed regarding assembly 100 and referencing a generalized semiconductor die 220, the dies 220a, 220b each may include (i) a die wafer 221 having a top surface and a bottom surface opposite the top surface, (ii) die openings 232 in the die wafer 221 extending from the top surface to the bottom surface and defining die opening walls 233. (iii) liners 234 on the die opening walls 233, (iv) one or more die conductive pads 226 on the bottom surface of the die wafer 221 each in vertical alignment with a corresponding die opening 232, and (v) the bottom dielectric layer 222 on the bottom surface of the die wafer 221 and at least partially covering the bottom surface and the die conductive pads 226. The first die 220a may further include a top dielectric layer 224a on the top surface of the die wafer 221a. The die openings 232, within the liners 234, may be filled by a portion of a corresponding device TSV 230 extending through the die 220 in alignment with the die opening 232 and the die conductive pad 226. The device TSV 230 may be in electric communication with the corresponding die conductive pad 226 and may further be in electric communication with the corresponding die wafer 221 via the die conductive pad 226. In some embodiments, the die conductive pads 226 may be on the top surface of the die wafer 221 or the die conductive pads 226 may be on both the top and bottom surfaces of the die wafer 221. The second die 220b may be stacked and bonded to the first die 220a with the die openings 232b in vertical alignment with corresponding die openings 232a.

The molds 260 may be columns of easily etchable molding material laterally adjacent to the dies 220a. 220b extending from the bottom surface of the bottom dielectric layer 222a to the top surface of the top dielectric layer 224b. In this arrangement, device TSVs 230 and TMVs 235 may extend through the dies 220a, 220b and the molds 260 and be a single elongated piece of conductive material (e.g., monolithic conductive column) formed in a single manufacturing step such as a single plating operation (discussed in detail in reference to FIGS. 18 and 19). Each device TSV 230 may be in electric communication with the dies 220a, 220b via the corresponding die conductive pads 226a. 226b, respectively. The dies 220a, 220b may be separated and insulated from the TMVs 235 by the molds 260.

The die TSVs 130 and the device TSVs 230, and the assembly 100 and the device 200 generally, provide benefits over conventional structures within semiconductor assemblies. In conventional semiconductor dies, TSVs are formed within each die. When these conventional dies are bonded into a semiconductor die or device assembly, additional conductive material (e.g., solder) must be used to connect the TSVs of adjacent dies to create electric communication therebetween. Further, semiconductor die structures introduce material-property-based limitations on performance, restricting the amount of electricity that may vertically pass through a semiconductor die.

Regarding interconnection of dies, some TSVs may be underfilled or overfilled, creating a concave recess or convex protrusion, respectively, where the TSVs meet an exterior surface of the die. When a recess is present, a manufacturer may unknowingly use insufficient additional conductive material to connect the TSVs of adjacent dies and create ineffective connections and inoperative semiconductor die assemblies. When a protrusion is present, a manufacturer may unknowingly use too much additional conductive material to connect the TSVs of adjacent dies and cause the adjacent dies to separate near the excess material, leading to ineffective connections or semiconductor die assembly failure due to die separation.

Regarding material-property-based limitations, the small amount of space on a semiconductor die dedicated to conductive columns requires the conductive columns to be extremely small. Because semiconductor dies are already so small, this limit on conductive columns introduces material-property-based limitations on the amount of electricity that may pass vertically through semiconductor dies within a stacked semiconductor die assembly.

In contrast, the die TSVs 130 and the device TSVs 230 are, for example, manufactured into the assembly 100 or device 200 after dies 120a-d, 220a, 220b, respectively, are bonded together. This method eliminates the need for the additional conductive material (e.g., solder) to connect TSVs of adjacent dies. Underfill and overfill and their respective negative outcomes are therefore avoided because only one TSV is required for multiple dies. This method further provides the benefit of distributing stress, pressure, or other forces generated by the cooling, solidification, crystallization, or similar post-manufacturing settling processes within or along the length of the TSV. Additionally, the TMVs 135, 235 are, for example, manufactured into the assembly 100 or device 200 through molds 160, 260 adjacent to dies 120a-d. Because the TMVs 135, 235 do not extend through the dies 120a-d and therefore are not sharing space with die 120a-d components, they are less restricted in size and may be wider. Because the TMVs 135, 235 are wider, they are less affected by material-property-based limitations and may allow a larger amount of electricity to pass through the assembly 100 to the base die 110 or through the device 200 to components below the device 200.

FIGS. 3-19B illustrate a process for producing the assembly 100 having die TSVs 130 extending through and in electric communication with the dies 120a-d and TMVs 135 extending through molding material 160 in electric communication with the base die 110 in accordance with some embodiments of the present technology. The process may, generally, include (i) preparing the die 120a, (ii) adhering the die 120a to a carrier wafer 105 (FIG. 3), (iii) cutting die openings 132a into the die wafer 121a (defining the die opening walls 133a), (iv) adding liners 134a to the die opening walls 133a, (v) adding plugs 136a within the die openings 132a, (vi) adding the top dielectric layer 124a, (vii) bonding the die 120a to the base die 110, (viii) repeating steps (i)-(vii) to consecutively prepare, adhere, modify, and bond the dies 120b-d of the assembly 100, (ix) adding a molding material (used to form molds 160) over the assembly 100, (x) cutting the assembly 100 to expose the die 120d. (xi) adding a photo resistive layer 150 over the die 120d, (xii) cutting assembly openings 138, 139 into the assembly 100, (xiii) forming the dic TSVs 130 and TMVs 135 in the assembly openings 138, 139, respectively, (xiv) removing the photo resistive layer 150, (xv) adding the cover layer 140, and (xvi) adding the external TSVs 114 and electric connectors 118. The process for producing the device 200 may include all, some, or similar elements to the process summarized above and described below regarding FIGS. 3-19B and can be used, for example, to prepare and bond the dies 220a, 220b and form the molds 260 of the device 200 and form the device TSVs 230 and TMVs 235 therein, respectively.

Figure 3:
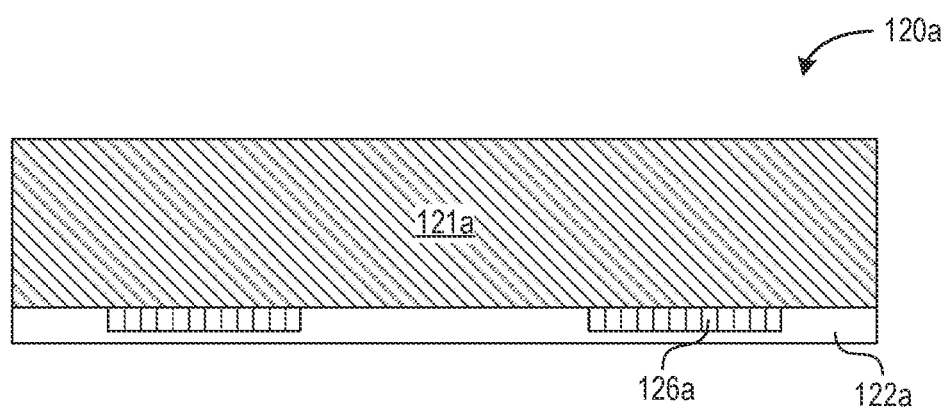
FIGS. 3-19B illustrate a process for producing a semiconductor device assembly with monolithic conductive columns extending through dies and molding material in accordance with some embodiments of the present technology.
Figure 4:
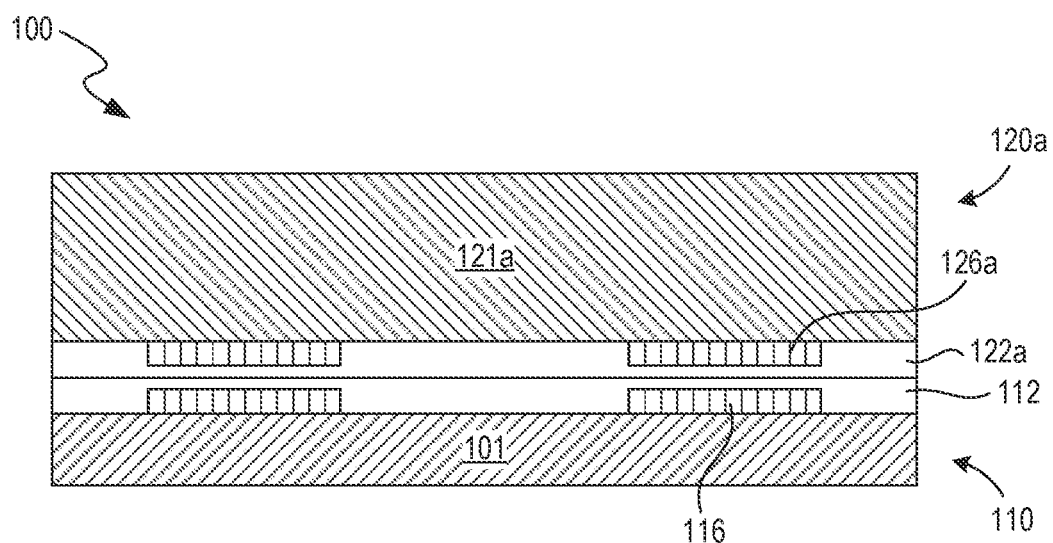

FIG. 3 illustrates the die 120a after forming the die conductive pads 126a on the bottom surface of the die wafer 121a and applying the bottom dielectric layer 122a at least partially covering the bottom surface of the die wafer 121a and the die conductive pads 126a. In some embodiments, and as illustrated in FIGS. 4A and 4B, the die 120a may further include one or more thermal pads 125. When the thermal pads 125 are included, the bottom dielectric layer 122a may further cover the thermal pads 125.

FIG. 4A illustrates a side view of the die 120a with thermal pads 125. FIG. 4B illustrates a top view of the die 120a with multiple possible thermal pads 125. For illustrative purposes, the dielectric layer 122a is omitted in FIG. 4B. The thermal pads 125 may be formed on the bottom surface of the die wafer 121a following the same or similar process as the die conductive pads 126a. The thermal pads 125 may distribute heat within the die 120a along a dimension of each thermal pad 125, increasing overall die 120a thermal transmittivity. Additionally or alternatively, the thermal pads 125 may be included on the top surface of the die wafer 121a. When thermal pads 125 are included, one or more of the thermal pads 125 may have a rectangular, circular, ovular, or other similar shape. Additionally or alternatively, one or more of the thermal pads 125 may have a free, as-formed shape corresponding with how the thermal pad 125 set during manufacture. The thermal pads 125 can be formed from any suitable conductive metal (or metal plating) such as copper, gold, silver, aluminum, tungsten, cobalt, nickel, or any other suitable conductive material.

Figure 5:
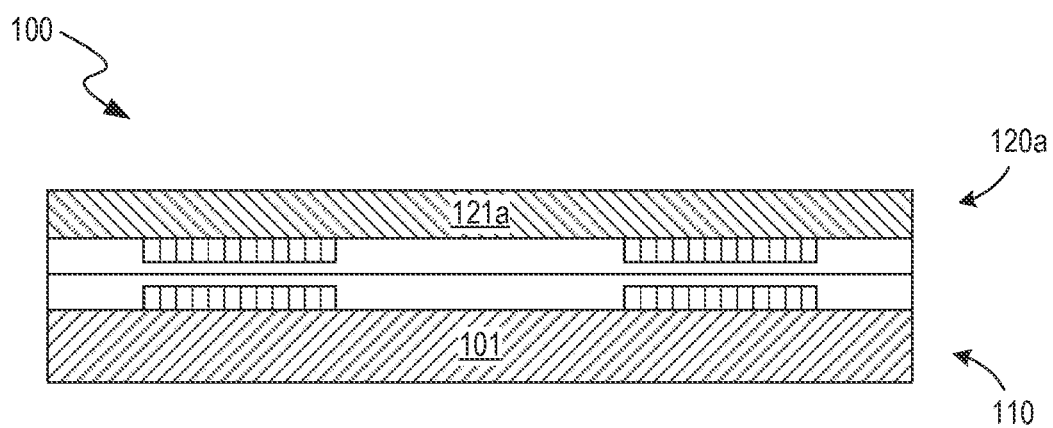

FIG. 5 illustrates the die 120a after adhering the die 120a to the carrier wafer 105. The bottom dielectric layer 122a may act to insulate the bottom surface of the die wafer 121a and the die conductive pads 126a. The die wafer 121a may be adhered to the carrier wafer 105 using a temporary adhesive 106.

Figure 6:
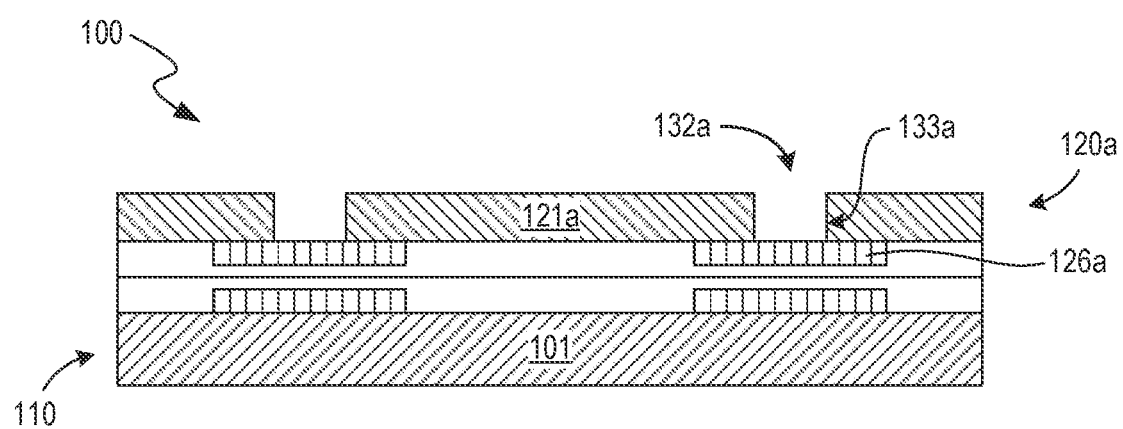

FIG. 6 illustrates the assembly 100 after the die openings 132a are cut into the die wafer 121a. The die openings 132a may be etched into the die wafer 121a or may be formed using any suitable mechanical or chemical process for cutting the die openings 132a into the die wafer 121a. As illustrated, the die openings 132a may extend from the top surface of the die wafer 121a to the bottom surface of the die wafer 121a and a top surface of the die conductive pads 126a and may define dic opening walls 133a. The die openings 132a may have a substantially circular cross-section, providing a void in the die wafer 121a. In some embodiments, a diameter of the circular cross-section may be the same for all of the die openings 132a. In other embodiments, the diameter may vary for some or all of the die openings 132a. In some embodiments, the cross-section of the die openings 132a may be noncircular. For example, but not as a limitation thereto, the cross-section may be a square, a rectangle, or any other shape providing a void in the die wafer 121a and the die opening walls 133a.

Figure 11:
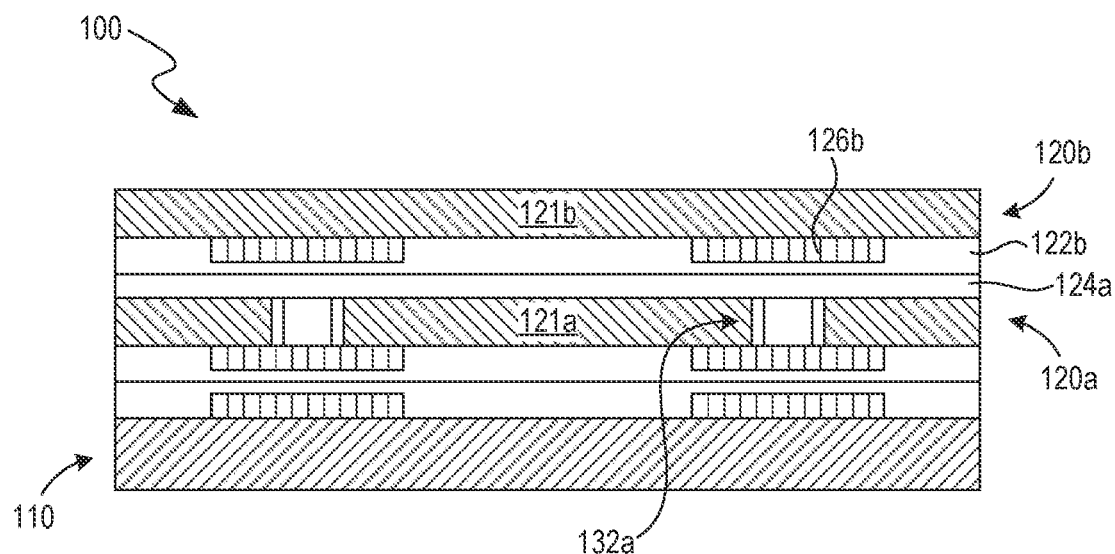

In some embodiments, the die 120a may be bonded directly to the base die 110 by bonding the bottom dielectric layer 122a to the base dielectric layer 112. Once the die 120a is bonded to the base die 110, the die openings 132a may similarly be etched or otherwise cut into the die wafer 121a in vertical alignment with corresponding base-dic pads 116a (similar to die openings 132a, as shown in FIG. 11).

Figure 7:
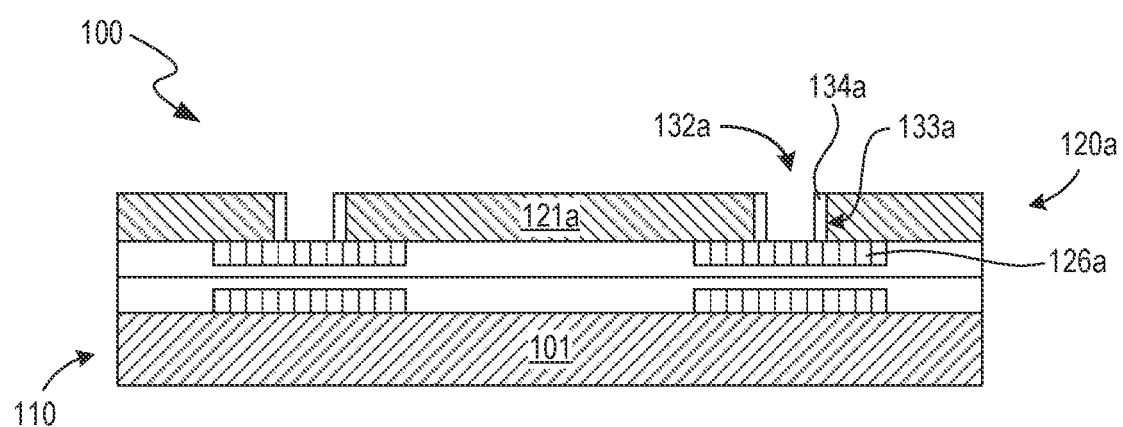

FIG. 7 illustrates the assembly 100 after the liners 134a are applied to the die opening walls 133a. The liners 134a may be applied to the die opening walls 133a using any suitable additive manufacturing processes that may adhere the liners 134a to the die opening walls 133a to achieve a radial thickness into the die openings 132a of 0.8 µm, 1.0 µm, 1.2 µm, or 1.4 µm. The liners 134a may further have a thickness larger, smaller, or between these values. The liners 134a may comprise any non-conductive, dielectric material that may bond with the die wafer 121a at the die opening walls 133a. As illustrated, the liners 134a may fill a portion of the die openings 132a radially inward from the die opening walls 133a and insulate the die wafer 121a from the remainder of the die openings 132a.

Figure 8:
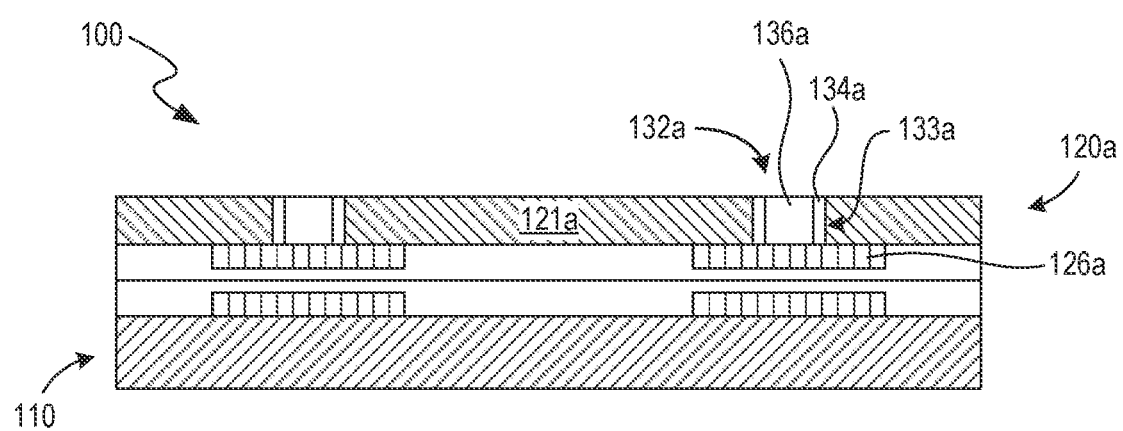

FIG. 8 illustrates the assembly 100 after the plugs 136a are applied within the remainder of the die openings 132a. The plugs 136a may be applied using any suitable additive manufacturing process for applying the plugs 136a within the die openings 132a from the top surface of the die conductive pads 126a to the top surface of the die wafer 121a. The plugs 136a may be any suitable non-conductive, easily etchable material that may fill the remainder of the die openings 132a. As illustrated, the plugs 136a insulate the die opening walls 133a and the top surface of the die conductive pads 126a.

Figure 9:
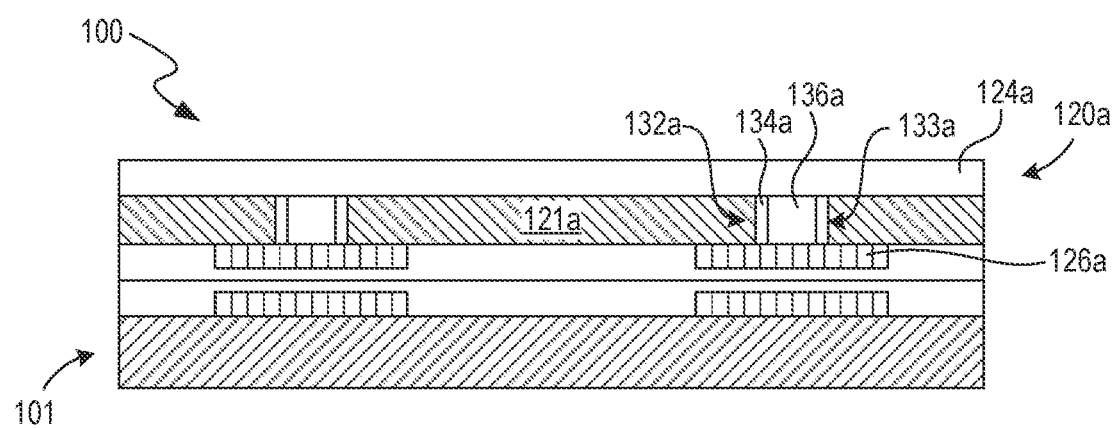

FIG. 9 illustrates the assembly 100 after the top dielectric layer 124a is applied to the top surface of the die wafer 121a, the liners 134a, and the plugs 136a. As illustrated, the top dielectric layer 124a may insulate the top surface of the die wafer 121a, the liners 134a, and the plugs 136a.

Figure 10A:
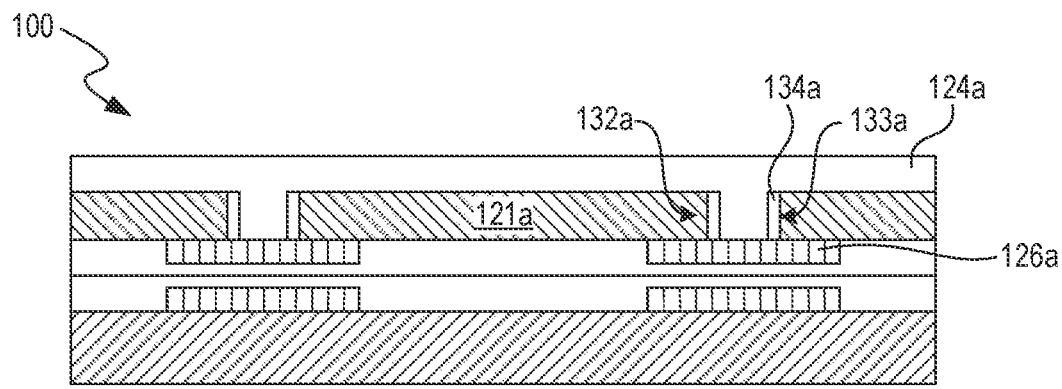
Figure 10B:
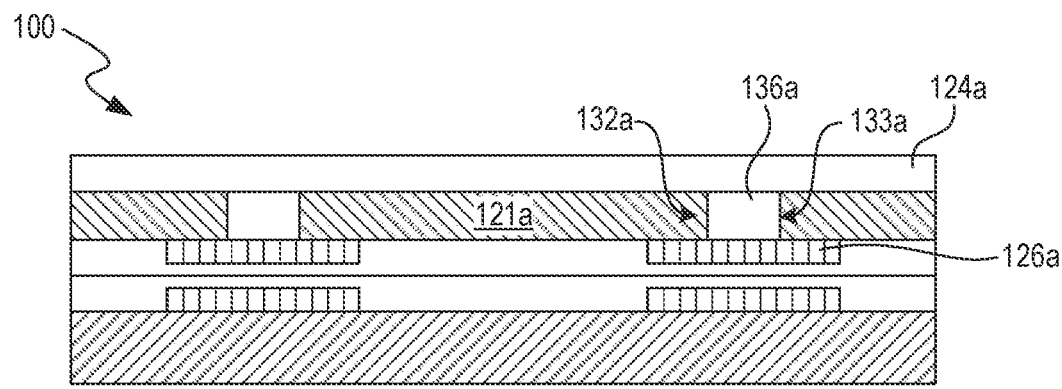
Figure 10C:
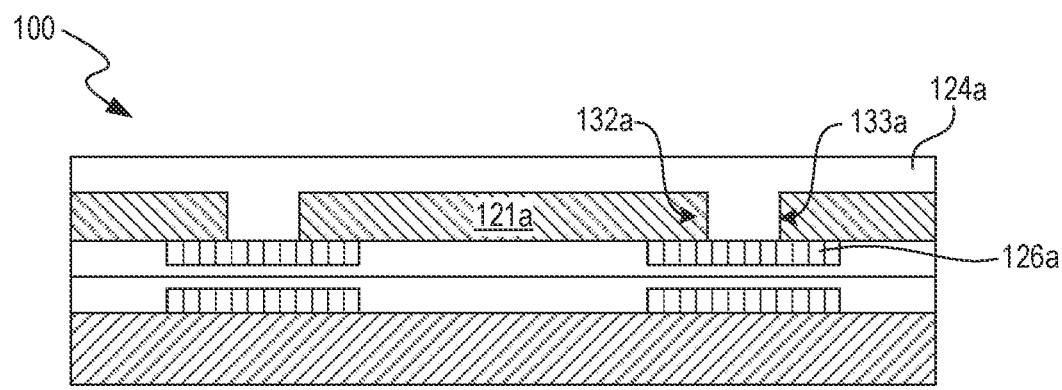

FIGS. 10A-10C illustrate some embodiments of the assembly 100 illustrated in FIG. 9. FIG. 10A illustrates the assembly 100 of FIG. 9 where the plugs 136a are not included. When the plugs 136a are not included, the liners 134a may be applied following the process illustrated in FIG. 7 and the process of FIG. 8 may be skipped. The top dielectric layer 124a may then be applied on the top surface of the die wafer 121a and to fill the remainder of the die openings 132a. FIG. 10B illustrates the assembly 100 of FIG. 9 where the liners 134a are not included. When the liners 134a are not included, the process illustrated in FIG. 7 may be skipped and the plugs 136a may be applied within the die openings 132a following the process of FIG. 8 and may be in contact with the die opening walls 133a and filling the die openings 132a. The top dielectric layer 124a may then be applied to the top surface of the die wafer 121a and a top surface of the plugs 136a. FIG. 10C illustrates the assembly 100 of FIG. 9 where the liners 134a and the plugs 136a are not included. When the liners 134a and the plugs 136a are not included, the processes of FIGS. 7 and 8 may be skipped and the top dielectric layer 124a may be applied on the top surface of the die wafer 121a and to fill the die openings 132a. In these illustrated embodiments of FIGS. 10A-10C, the top dielectric layer 124a, liners 134a, or plugs 136a, when included within the die openings 132a, may insulate the die wafer 121a within the die openings 132a.

FIG. 11 illustrates the assembly 100 after the dies 120a is bonded with the base die 110. When using a carrier wafer 105, the die 120a may be removed from the carrier wafer 105 and bonded with the base die 110 by bonding the bottom dielectric layer 122a to the base dielectric layer 112. When the die 120a is bonded to the base die 110, the die openings 132a may be placed in vertical alignment with corresponding base-die pads 116a. As illustrated, the base die 110 may be insulated from the die 120a by the base dielectric layer 112 and the bottom dielectric layer 122a. When not using a carrier wafer 105, this step may be skipped.

Figure 12:
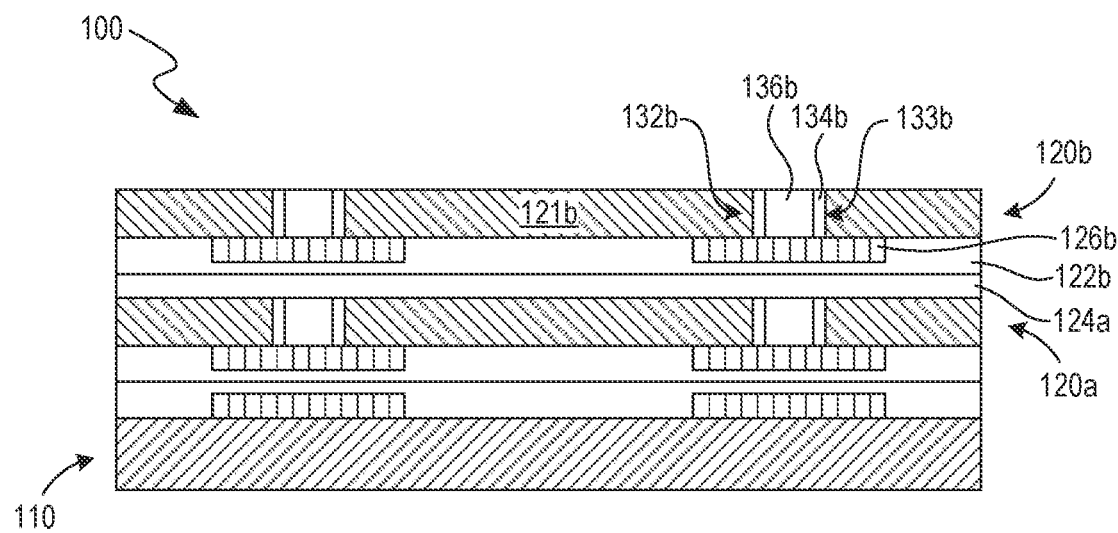
Figure 13:
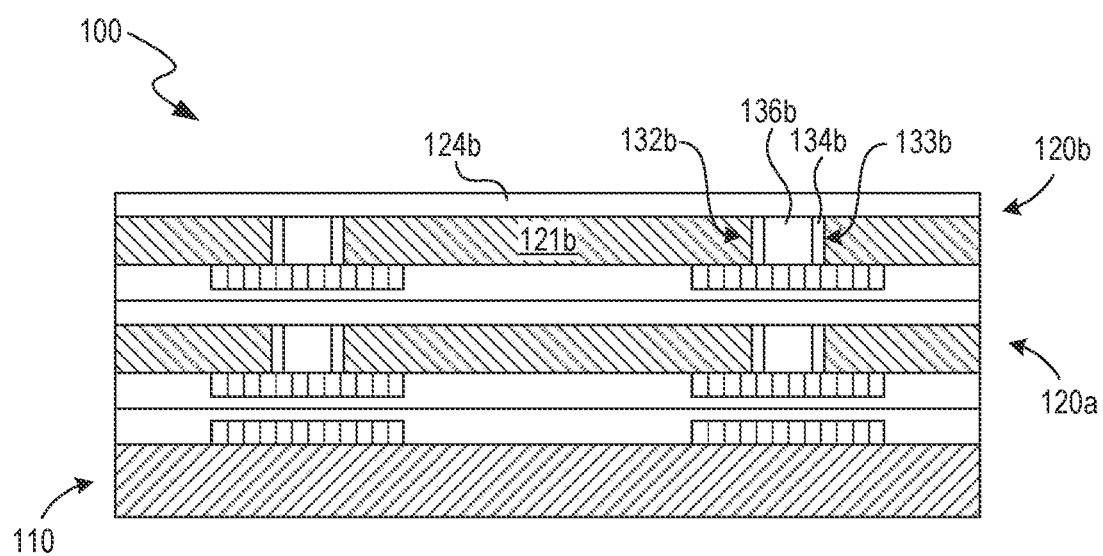

FIG. 12 illustrates the assembly 100 after the die 120b is prepared and bonded to the assembly 100. The die 120b may be prepared for bonding to the assembly 100 following the process of FIGS. 3-9. The die 120b may be adhered to the carrier wafer 105 following the process of FIG. 3; the die openings 132b may be cut following the process of FIG. 6, defining die opening walls 133b; the liners 134b and plugs 136b may be applied following the process of FIGS. 7 and 8; and the top dielectric layer 124b may be applied following the process of FIG. 9. As illustrated, the liners 134b and the plugs 136b fill the die openings 132b cut into the die wafer 121b and insulate the die wafer 121b and the top surface of the die conductive pad 126b, and the top dielectric layer 142b insulates the top surface of the die wafer 121b, the liners 134b, and the plugs 136b. In some embodiments, the die 120b may instead correspond with an embodiment illustrated in one of FIGS. 10A-10C, regarding the liners 134b, the plugs 136b, and the top dielectric layer 124b. Once prepared, the die 120b may be removed from the carrier wafer 105 and bonded to the die 120a by bonding the bottom dielectric layer 122b with the top dielectric layer 124a. When the die 120b is bonded to the die 120a, the die openings 132b may be placed in vertical alignment with corresponding die openings 132a. As illustrated, the die 120a is insulated from the die 120b by the top dielectric layer 124a and the bottom dielectric layer 122b.

FIGS. 13A and 13B illustrate the assembly 100 after the die 120c and the die 120d are prepared and bonded to the assembly 100. The die 120c and the die 120d may consecutively (i) be adhered to the carrier wafer 105 following the process of FIG. 3, (ii) have die openings 132c, 132d cut into the die wafers 121c, 121d following the process of FIG. 6, defining die opening walls 133c, 133d, (iii) have the liners 134c, 134d and plugs 136c, 136d applied within the die openings 132c, 132d following the process of FIGS. 7 and 8. (iv) have the top dielectric layers 124c, 124d applied following the process of FIG. 9, and (v) once prepared, the dies 120c. 120d may be removed from the carrier wafer 105 and bonded to the assembly 100. When the die 120c and the die 120d are bonded to the assembly 100, the die openings 132c, 132d may be placed in vertical alignment with corresponding die openings 132a, 132b.

In some embodiments, and as illustrated in FIG. 13B, the assembly 100 may further include the thermal pads 125 in some of the dies 110, 120a-120d. When thermal pads 125 are included throughout the assembly 100, the thermal pads 125 may increase overall thermal transmissivity of the assembly 100. The thermal pads 125 may be included in one, some, or all of the dies 110, 120a-120d. Regarding the dies 120a-120d, the thermal pads 125 may be on the top surface or the bottom surface of the die wafers 121a-121d, respectively. In some embodiments, the die 120c or the die 120d may instead correspond with an embodiment illustrated in one of FIGS. 10A-10C, regarding the liners 134c, 134d, plugs 136c, 136d, and the top dielectric layers 124c, 124d. As illustrated, the die 120b is insulated from the die 120c by the top dielectric layer 124b and the bottom dielectric layer 122c, and the die 120c is insulated from the die 120d by the top dielectric layer 124c and the bottom dielectric layer 122d.

Figure 14:
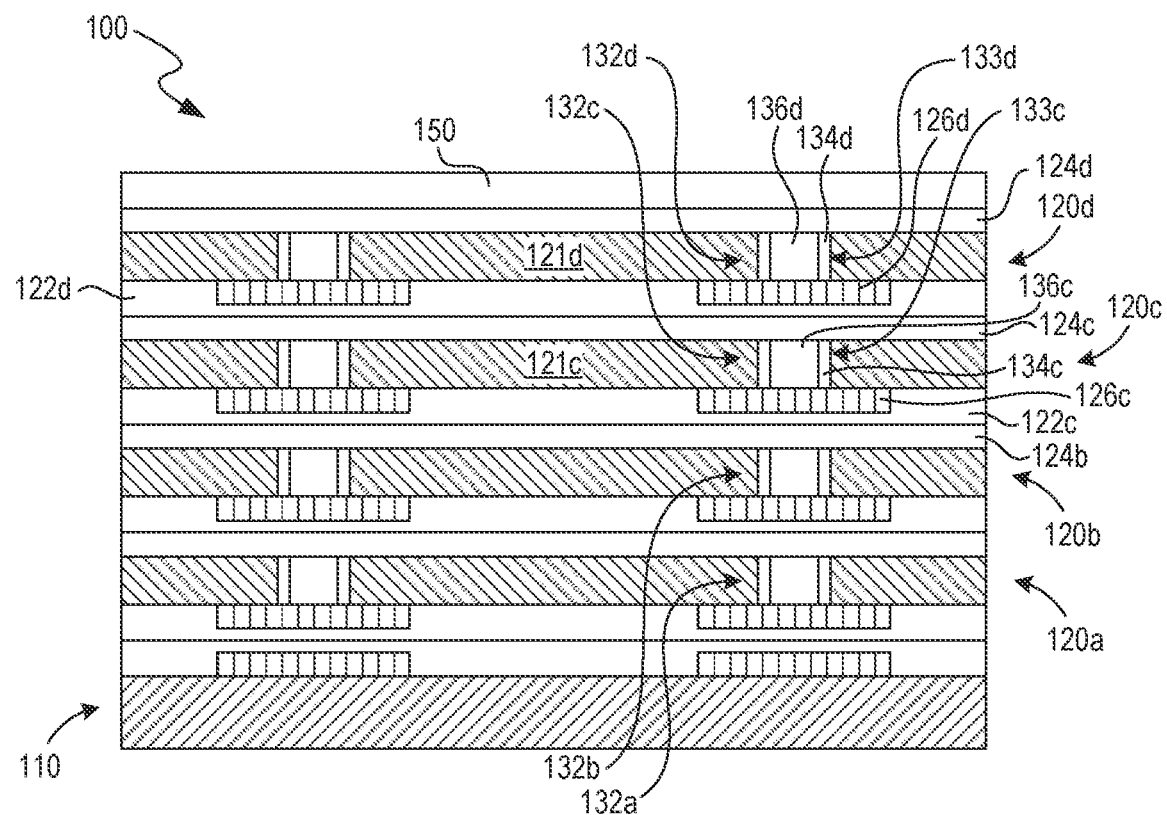

FIG. 14 illustrates the assembly 100 after a molding material has been applied over the assembly 100. The molding material (used to form molds 160, as illustrated by the dashed line) may be formed by dipping the assembly 100, dies 120a-d first, into a liquid molding material and removing the assembly 100 from the liquid molding material and allowing the material to harden. In some embodiments the molding material may be applied over the assembly 100 while the assembly 100 is upright (as shown in FIG. 14). As illustrated, the molding material encases and insulates an exterior surface of the dies 110, 120a-d.

Figure 15:
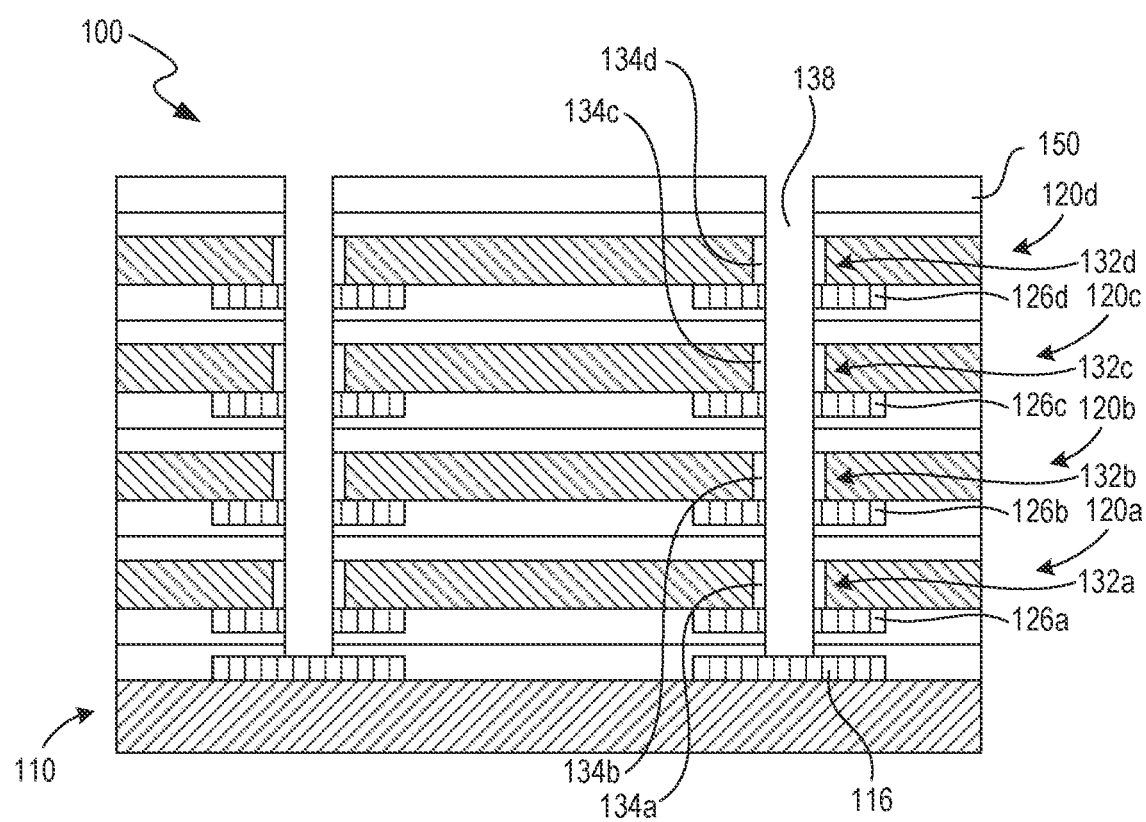

FIG. 15 illustrates the assembly after the molds 160 are formed and a photo resistive layer 150 is applied to an interim top surface of the assembly 100. The molds 160 may be formed by mechanically or chemically etching the molding material to be flush with the top surface of the top dielectric layer 124d. In this structure, the molds 160 extend from the base die 110 to the top surface of the top dielectric layer 124d, laterally adjacent to the dies 120a-d. After the molds 160 are formed, the photo resistive layer 150 may be applied to the re-exposed top surface of the top dielectric layer 124d and a top surface of the molds 160. The photo resistive layer 150 may be a protective layer having a top surface and may be made of a polymer or any suitable material for protecting the assembly 100 when the die assembly openings 138 (FIG. 16) are etched into the assembly 100. The photo resistive layer 150 may be applied using any suitable additive manufacturing process, including, but not limited to, sputtering, physical vapor deposition (PVD), electroplating, lithography, or other similar processes. In some embodiments, the molding material may only be partially etched leaving a portion of the molding material extending from the molds 160 and over the top dielectric layer 124b. In these embodiments, the photo resistive layer 150 may be applied over the molds 160 and the portion of the molding material extending over the top dielectric layer 124b.

Figure 16:
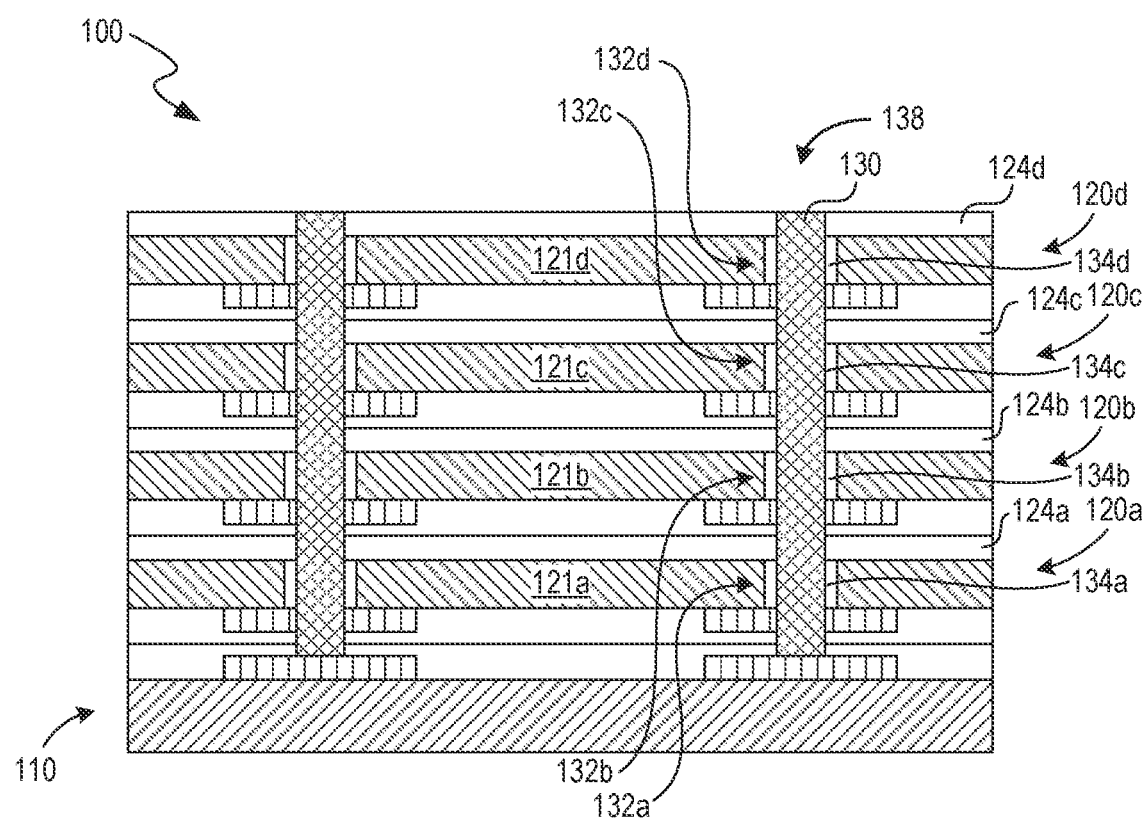

FIG. 16 illustrates the assembly 100 after die assembly openings 138 and mold openings 139 are etched into the assembly 100. After the dies 120a-d, the molds 160, and the photo resistive layer 150 are added to the assembly 100, the die assembly openings 138 may be etched into the assembly 100 by, in part, removing material from the dies 120a-d and the mold openings 139 (collectively, "the assembly openings 138, 139") may be etched into the assembly 100 by, in part, removing material from the molds 160. The die assembly openings 138 and the mold openings 139 both provide elongated voids in the assembly 100. The die assembly openings 138 may have a cross-section corresponding with the cross-section of the die openings 132a-d and a cross-sectional area. For example, when the die openings 132a-d have a substantially circular cross-section, the die assembly openings 138 may also have a circular cross-section. The mold openings 139 may have a cross-section corresponding with or different from the cross-section of the die assembly openings 138. Regardless of cross-section, the mold openings 139 may have a larger cross-sectional area than the cross-sectional area of the die assembly openings 138.

When the die assembly openings 138 have a circular cross-section, a diameter of the die assembly openings 138 may correspond with the thickness of the liners 134a-d such that only plugs 136a-d material is removed from the die openings 132a-d. In some embodiments the diameter may correspond with the thickness of the liners 134a-d such that all plugs 136a-d material is removed and some liners 134a-d material is removed. When the die openings 132a-d have a non-circular cross-section, dimensions of the cross-section of the die assembly openings 138 may similarly be non-circular and modified to remove only plugs 136a-d material or to remove all plugs 136a-d material and some liners 134a-d material.

As illustrated, two die assembly openings 138 and two mold openings 139 are etched into the assembly 100. In some embodiments, the assembly 100 may include additional (e.g., 3, 4, etc.) or a single die assembly opening 138 or mold opening 139. The die assembly openings 138 and the mold openings 139 may extend from the top surface of the photo resistive layer 150 to the top surface of the base conductive pads 116. In some embodiments, the die assembly openings 138 may instead extend from the top surface of the photo resistive layer 150 to the top surface of one of the die conductive pads 126a-d or a top surface of another structure within the assembly 100. In some embodiments, some die assembly openings 138 may extend from the top surface of the photo resistive layer 150 to the top surface of the base-die pads 116a and some die assembly openings 138 may extend from the top surface of the photo resistive layer 150 to the top surface of a structure other than the base-die pads 116a within the assembly 100.

Figure 17:
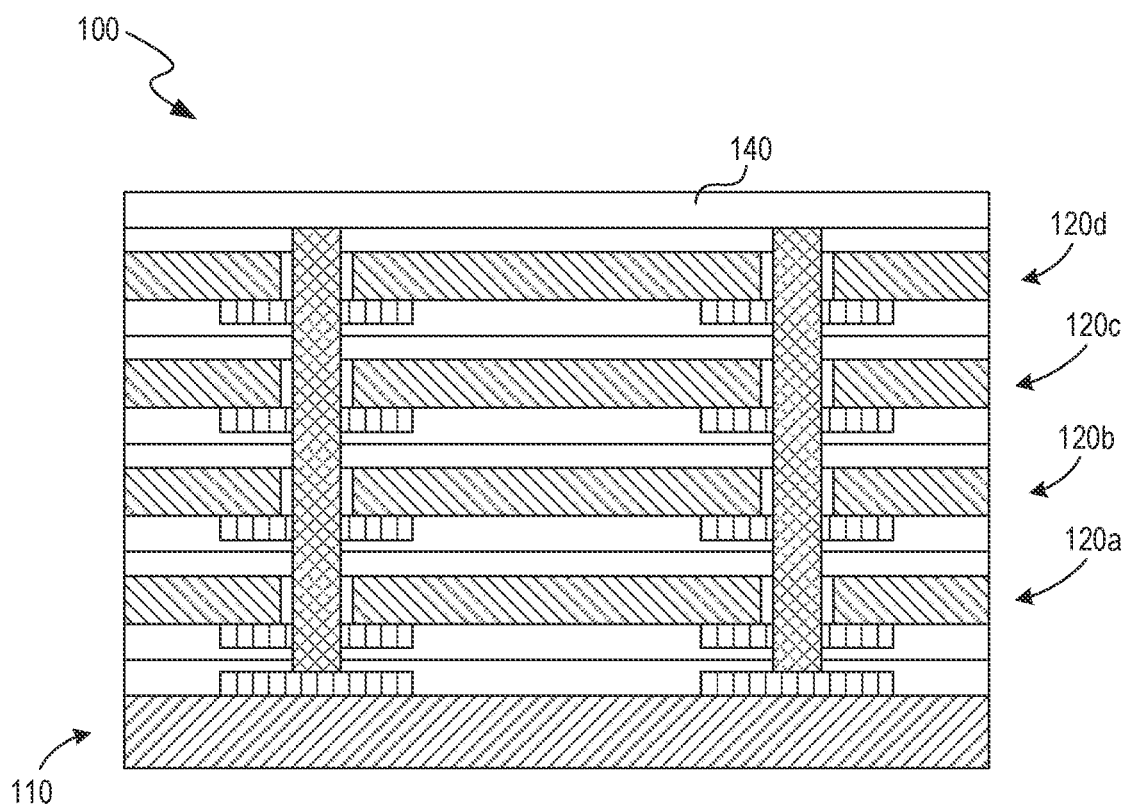

FIG. 17 illustrates the assembly 100 after die TSVs 130 have been formed in the die assembly openings 138, the TMVs 135 have been formed in the mold openings 139, and the photo resistive layer 150 has been removed. After the assembly openings 138, 139 have been etched into the assembly 100, the die TSVs 130 and the TMVs 135 may be formed (e.g., plated) into the assembly openings 138, 139. Once the die TSVs 130 and the TMVs 135 are formed, the photo resistive layer 150 and any portion of the die TSVs 130 and the TMVs 135 therein may be removed to re-expose the top dielectric layer 124d and provide a flat, top surface of the assembly 100. The die wafers 121a-d may be insulated from the die TSVs 130 by the remainder of the liners 134a-d, respectively. The dies 120a-d may be spaced and insulated from the TMVs 135 by the molds 160. In some embodiments, the liners 134a-d and a portion of the plugs 136a-d may insulate the die wafers 121a-d from the die TSVs 130, respectively. When the dies 120a-d correspond with an embodiment illustrated in one of FIGS. 10A-10C, the die wafers 121a-d may instead be insulated from the die TSVs 130 by the remainder of the plugs 136a-d or a portion of the top dielectric layers 124a-d, respectively. In embodiments where a portion of the molding material remains above the top dielectric layer 124b (as discussed regarding FIG. 15), removal of the photo resistive layer 150 may instead re-expose the molding material above the top dielectric layer 124b and the molds 160.

Figure 18A:
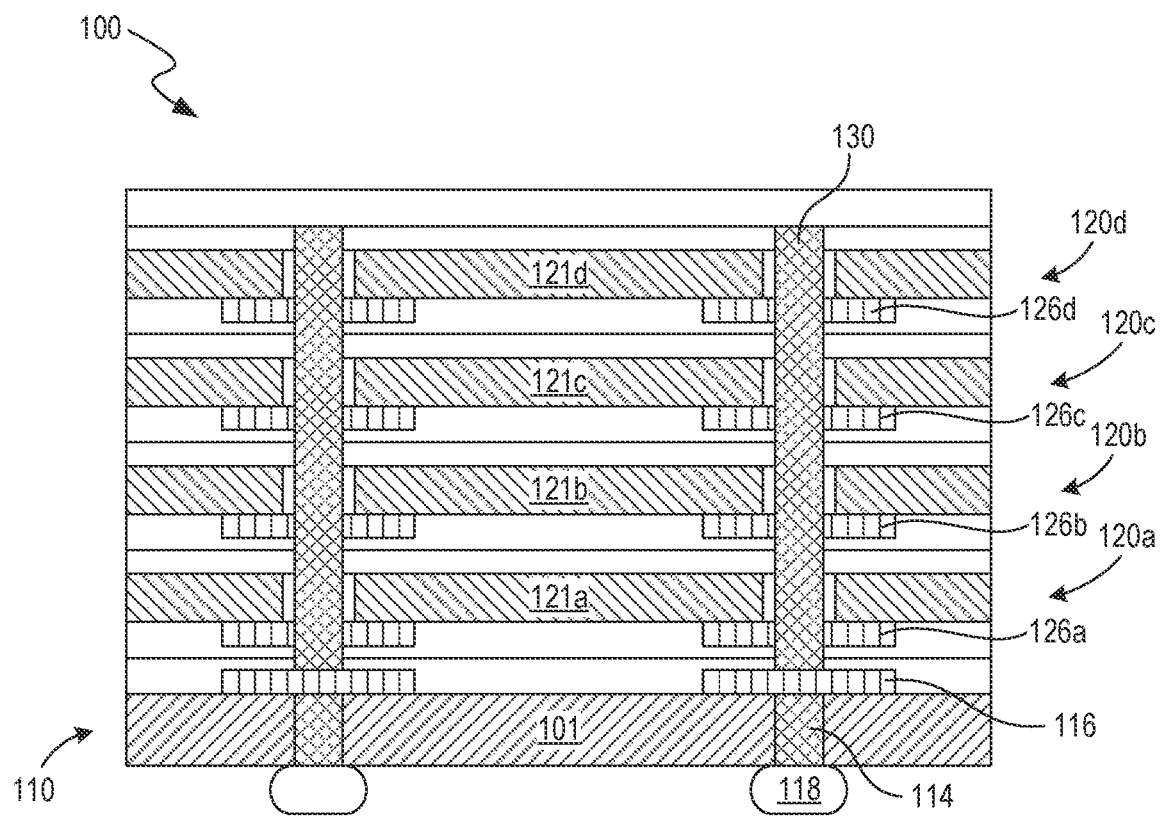
Figure 18B:
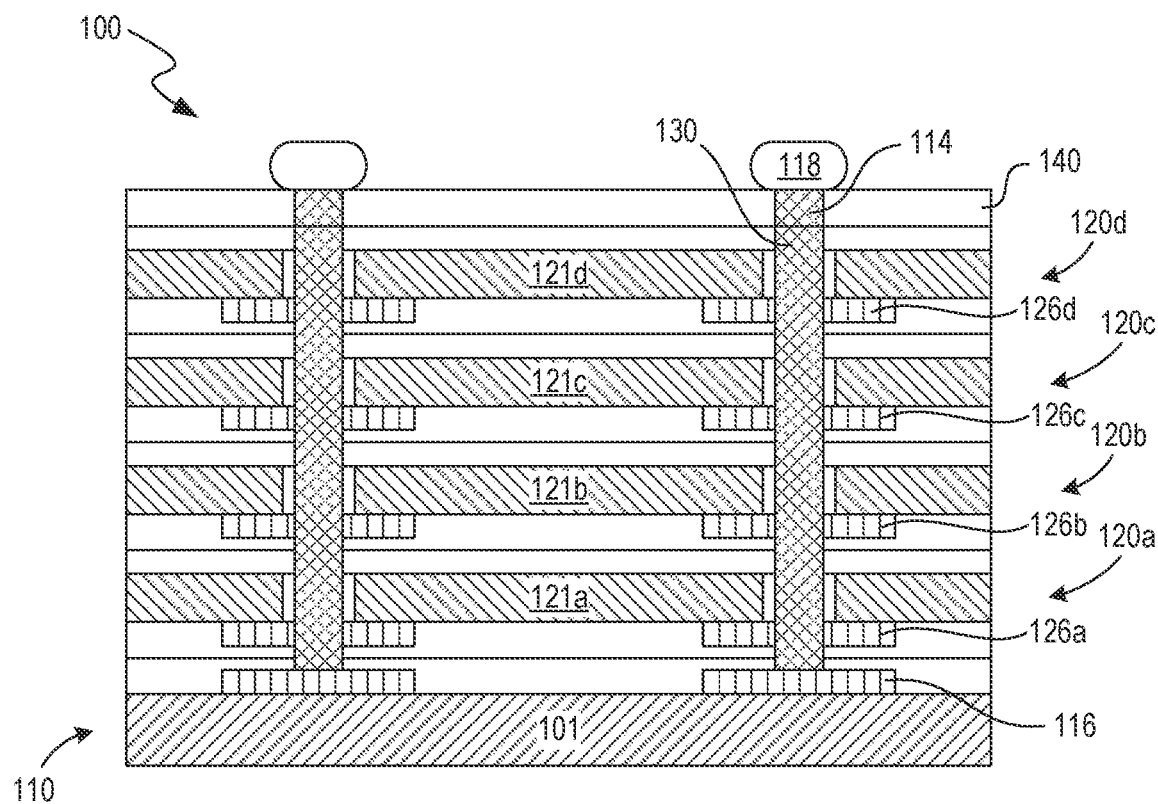

FIG. 18 illustrates the assembly 100 after the cover layer 140 has been applied to the top surface of the assembly 100. As illustrated, the cover layer 140 may insulate the top surface of the assembly 100.

Figure 19A:
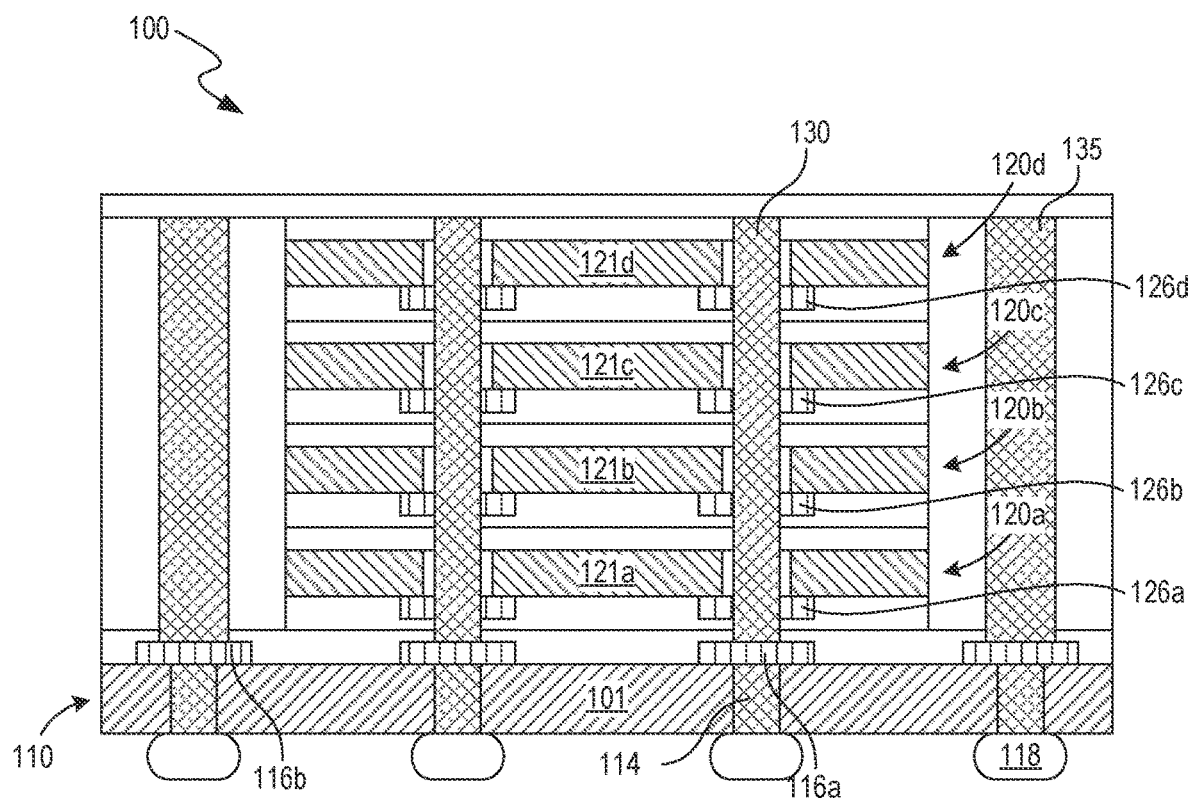
Figure 19B:
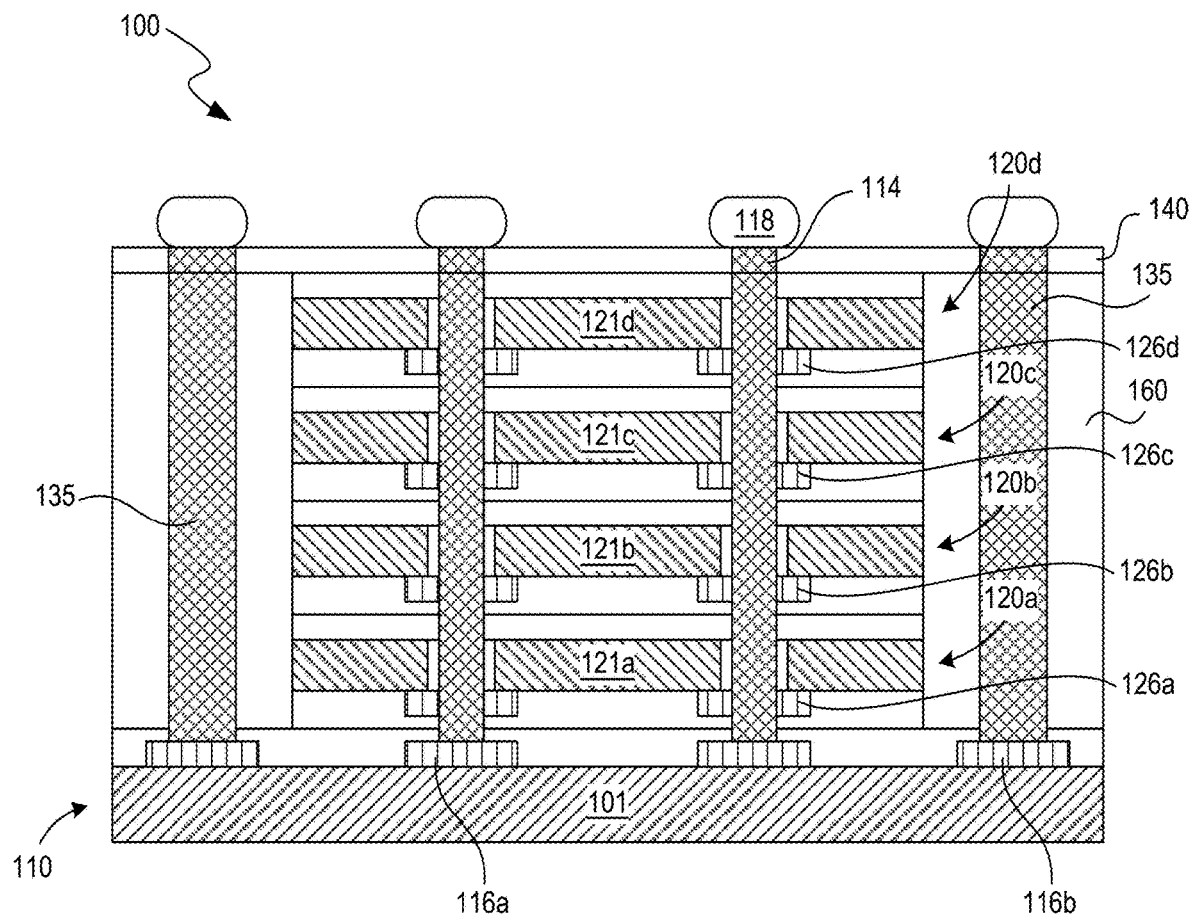

FIGS. 19A and 19B illustrate some embodiments of external TSVs 114 and electric connectors 118 included in the assembly 100. In FIG. 19A, four electric connectors 118 are coupled to the bottom surface of the base die 110 and are each in electric communication with corresponding external TSVs 114. The external TSVs 114 may be formed by etching openings in the base wafer 101 in vertical alignment with a corresponding base conductive pad 116. A conductive material may then be formed in the openings to produce the external TSVs 114. The electric connectors 118 each may then be coupled to the bottom surface of the base die 110 in vertical alignment with the external TSVs 114, respectively. The electric connectors 118 each may be in electric communication with the base conductive pads 116 and die TSVs 130 or TMVs 135 via the external TSVs 114, respectively.

In FIG. 19B, four electric connectors 118 are coupled to a top surface of the cover layer 140 and are each in electric communication with a corresponding external TSV 114. The external TSVs 114 may be similarly formed as in FIG. 19A by etching openings in the cover layer 140 and adding conductive material therein. Then the electric connectors 118 may each be coupled to the top surface of the cover layer 140 in vertical alignment with the external TSVs 114, respectively. The electric connectors 118 may be in electric communication with the die TSVs 130 and the TMVs 135 via the external TSVs 114, respectively.

The electric connectors 118 of FIGS. 19A and 19B in electric communication with die TSVs 130 may further be in electric communication with the dies 120a-d via the die conductive pads 126a-d, respectively. The electric connectors 118 of FIGS. 19A and 19B in electric communication with TMVs 135 may be in electric communication with the die 110 via base-mold pads 116b. In some embodiments, the assembly 100 may include additional (e.g., 3, 4, etc.) or a single electric connector 118 and corresponding external TSV 114, depending on the number of die TSVs 130 within the assembly 100 or whether an application of the assembly 100 requires more or fewer external electric connectors 118.

CONCLUSION

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device assembly, comprising:
   a base die, including:
      a semiconductor substrate including an upper surface,
      a die conductive pad and a mold conductive pad at the upper surface, wherein the mold conductive pad is laterally spaced from the die conductive pad, and
      a base dielectric layer disposed over the die conductive pad, the mold conductive pad, and the upper surface;
   a plurality of dies, each including:
      a semiconductor substrate including an upper surface and a lower surface,
      a conductive pad at the lower surface having a bottom surface opposite the lower surface,
      a lower dielectric layer disposed over the conductive pad and the lower surface,
      a die opening extending through the semiconductor substrate and the conductive pad from the bottom surface to the upper surface, and defining a die opening side wall of the semiconductor substrate and a side surface of the conductive pad,
      a non-conductive liner coating the die opening side wall, and
      an upper dielectric layer disposed over the upper surface, wherein the plurality of dies is stacked over the base die such that the die opening of each of the plurality of dies is vertically aligned with the die conductive pad;
   a molding material laterally adjacent to the plurality of dies;
   a die monolithic conductive column extending from the die conductive pad through the die opening of each of the plurality of dies and in direct contact with the side surface of the conductive pad of each of the plurality of dies; and
   a mold monolithic conductive column extending from the mold conductive pad through the molding material.

2. The semiconductor device assembly of claim 1, wherein the upper dielectric layer of at least one of the plurality of dies comprises the same material as and is integrally formed with the non-conductive liner of the at least one of the plurality of dies.

3. The semiconductor device assembly of claim 1, wherein the die conductive pad and the mold conductive pad each have an upper surface in the same first plane and the semiconductor device assembly has a second plane above the first plane, wherein the die monolithic conductive column and the mold monolithic column extend from the die conductive pad upper surface and the mold conductive pad upper surface, respectively, to the second plane.

4. The semiconductor device assembly of claim 1, wherein the semiconductor substrate of the base die further includes a lower surface opposite the upper surface and the semiconductor device assembly further comprises:
   a die external connector assembly, including:
      a die external conductive structure extending through the base die semiconductor substrate from the upper surface at the die conductive pad to the lower surface, and
      a die electric connector coupled to the lower surface of the base die semiconductor substrate at the die external conductive structure; and
   a mold external connector assembly, including:
      a mold external conductive structure extending through the base die from the upper surface at the mold conductive pad to the lower surface, and
      a mold electric connector coupled to the lower surface of the base die at the mold external conductive structure.

5. The semiconductor device assembly of claim 4, wherein the semiconductor device assembly is configured such that the die electric connector is in electrical communication with each of the plurality of dies via the die external conductive structure, the die conductive pad, the die monolithic conductive column, and the conductive pad of each of the plurality of dies.

6. The semiconductor device assembly of claim 1, wherein the semiconductor device assembly further comprises:
   a die electric connector coupled to an exterior upper surface of the semiconductor device assembly and in electric communication with the die monolithic conductive column; and
   a mold electric connector coupled to the exterior upper surface and in electric communication with the mold monolithic conductive column.

7. The semiconductor device assembly of claim 6, wherein the semiconductor device assembly comprises:
   an uppermost die of the plurality of dies as a top die stacked over the base die; and
   an assembly cover layer disposed over the dielectric layer of the uppermost die and the molding material, the assembly cover layer including an upper surface defining the exterior upper surface of the semiconductor device assembly.

8. The semiconductor device assembly of claim 1, wherein one of the plurality of dies further includes a thermal pad on the upper or lower surface thereof and configured to increase a thermal transmissivity of the one of the plurality of dies.

9. The semiconductor device assembly of claim 1, wherein the base die further includes a thermal pad on the upper surface thereof and configured to increase a thermal transmissivity of the base die.

10. A semiconductor device, comprising:
a semiconductor die, including:
   a semiconductor substrate having a first surface and a second surface opposite the first surface,
   a conductive pad at the first surface of the semiconductor substrate,
   a first dielectric layer disposed over the first surface and the conductive pad,
   an opening extending through the semiconductor substrate from the conductive pad at the first surface to the second surface, and defining an opening side wall,
   a non-conductive liner coating at least the opening side wall,
   a plug of non-conductive material filling the opening, and
   a second dielectric layer covering the second surface and the plug; and
a molding material laterally adjacent to the semiconductor die.

11. The semiconductor device of claim 10, further comprising:
a second semiconductor die, including:
   a second semiconductor substrate with a top surface and a bottom surface opposite the top surface,
   a second conductive pad at the bottom surface of the second semiconductor substrate,
   a bottom dielectric layer disposed over the bottom surface and the second conductive pad, and
   a second opening extending through the second semiconductor substrate from the second conductive pad to the top surface, wherein the bottom dielectric layer is bonded to the second dielectric layer with the second opening in alignment with the opening, and wherein the molding material is further laterally adjacent to the second semiconductor die.

12. The semiconductor device of claim 10, wherein a second conductive pad is at the first surface of the semiconductor substrate and a second opening extends through the semiconductor substrate from the second conductive pad to the second surface of the semiconductor substrate.

13. The semiconductor device of claim 12, wherein the second opening defines a second opening side wall with a second non-conductive liner coating at least the second opening side wall and a second plug of non-conductive material filling the second opening.

14. The semiconductor device of claim 10, wherein the non-conductive liner and the plug comprising the same non-conductive material and integrally formed together.

15. The semiconductor device of claim 10, wherein the semiconductor die further includes a thermal pad at the first surface and adjacent to the conductive pad.

16. The semiconductor device of claim 10, wherein the non-conductive liner, the plug, and the second dielectric layer comprising the same non-conductive material.

17. The semiconductor device of claim 16, wherein the non-conductive liner, the plug, and the second dielectric layer are integrally formed together.

18. A method of manufacturing a semiconductor device assembly, comprising:
providing a plurality of semiconductor devices, each having a semiconductor substrate with a first surface and a second surface, a conductive pad at the first surface, and a first opening extending through the semiconductor substrate from the conductive pad at the first surface to the second surface;
filling the first opening of each of the plurality of semiconductor devices with a sacrificial plug of non-conductive material;
stacking the plurality of semiconductor devices such that the plug of each of the plurality of semiconductor devices is vertically aligned;
laterally encasing the stacked plurality of semiconductor devices in a molding material;
forming a device opening through the stacked plurality of semiconductor devices and a mold opening through the molding material, the device opening extending through the conductive pad and the sacrificial plug of non-conducive material of each of the plurality of semiconductor devices; and
disposing a monolithic conductive column in each of the device opening and the mold opening, wherein the monolithic conductive column in the device opening is in electrical communication with the conductive pad of each of the stacked plurality of semiconductor devices and is electrically isolated from the semiconductor substrate of each of the stacked plurality of semiconductor devices by a remaining portion of the sacrificial plug of non-conductive material, and wherein the stacked plurality of semiconductor devices is isolated from the monolithic conductive column in the mold opening by the molding material.

19. The method of claim 18, wherein filling the first opening of each of the plurality of semiconductor devices with the sacrificial plug of non-conductive material further includes also applying the non-conductive material to the second surface.

20. The method of claim 18, wherein disposing the monolithic conductive column in the device opening includes plating or sintering the monolithic conductive column within the device opening.

* * * * *